United States Patent
Brigante et al.

(12) United States Patent (10) Patent No.: US 6,356,653 B2
Brigante et al. (45) Date of Patent: *Mar. 12, 2002

(54) METHOD AND APPARATUS FOR COMBINED PARTICLE LOCATION AND REMOVAL

(75) Inventors: Jeffrey A. Brigante, Colchester; Glenn W. Gale, Essex Junction; Maurice R. Hevey, Burlington; Frederick W. Kern, Jr., Colchester; Ben Kim, S. Burlington; Joel M. Sharrow, South Hero; William A. Syverson, Colchester, all of VT (US)

(73) Assignee: International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/116,680

(22) Filed: Jul. 16, 1998

(51) Int. Cl.[7] .................................................. G06K 9/00
(52) U.S. Cl. ....................... 382/145; 382/149; 382/153; 382/144
(58) Field of Search .................................. 382/145, 147, 382/149, 151, 144, 141, 153; 438/4, 16, 795, 690, 14; 219/121.84; 15/1.51; 372/107; 348/86, 87, 125, 126

(56) References Cited

U.S. PATENT DOCUMENTS

| | | | |
|---|---|---|---|
| 4,377,340 A | 3/1983 | Green et al. | |
| 4,441,124 A | 4/1984 | Heebner et al. | |
| 4,641,967 A | * 2/1987 | Pecen | 356/237.3 |
| 4,740,708 A | 4/1988 | Batchelder | |
| 5,030,842 A | 7/1991 | Koshinaka et al. | |
| 5,328,555 A | 7/1994 | Gupta | |
| 5,387,777 A | 2/1995 | Bennett et al. | |
| 5,467,188 A | 11/1995 | Miyashita | |
| 5,471,541 A | * 11/1995 | Burtnyk et al. | 382/153 |
| 5,486,919 A | 1/1996 | Tsuji et al. | |
| 5,496,506 A | 3/1996 | Sato | |
| 5,622,595 A | 4/1997 | Gupta et al. | |
| 5,634,230 A | * 6/1997 | Maurer | 15/1.51 |
| 5,640,238 A | 6/1997 | Nakano et al. | |
| 5,958,268 A | * 9/1999 | Engelsberg et al. | 219/121.84 |

* cited by examiner

Primary Examiner—Joseph Mancuso
Assistant Examiner—Vikkram Bali
(74) Attorney, Agent, or Firm—Scully, Scott, Murphy & Presser; Mark F. Chadurjian

(57) ABSTRACT

A method for removing one or more particles from a surface of an object is provided. The method has first and second steps of detecting and locating the one or more particles on the surface of the object. In a third step, focused energy is directed onto one or more of the detected particles to break a bond energy between the one or more particles and the surface thereby removing the one or more particles from the surface. In preferred variations of the method of the present invention, the object is a semiconductor wafer and the directed focused energy is in the form of a laser. Also provided is an apparatus for removing the plurality of particles from the surface of the object. The apparatus includes a detector for detecting and locating the plurality of particles on the surface of the object, and a laser for directing focused energy on one or more of the detected particles to break a bond energy between the one or more particles and the surface thereby removing the one or more particles from the surface.

34 Claims, 2 Drawing Sheets

METHOD AND APPARATUS FOR COMBINED PARTICLE LOCATION AND REMOVAL

BACKGROUND OF THE INVENTION

1. Field of the Invention

This invention relates to method and apparatus for combined particle location and removal. More specifically, this invention relates to method and apparatus for combined particle location and removal from the surface of a semiconductor wafer by focusing energy from a focused energy source, such as a laser, onto the located particles.

2. Description of the Related Art

In the manufacture of microelectronic devices, particularly VLSI and ULSI devices, in which the overall dimensions of devices are becoming smaller and more closely packed, and the critical dimensions are becoming much smaller, particle contamination is of increasing concern. The presence of particles during growth, deposition, or etching of thin films can cause voids, dislocations or shorts which adversely affect performance and reliability of the devices. Accordingly, one step in the manufacturing process is the cleaning of the device's surface to remove particulate contamination. Thereafter, it may be necessary to inspect the cleaned surface to insure that it has been cleaned adequately of the contaminants and not damaged by the cleaning process.

Many procedures for detecting particles on the surface of semiconductor devices and generating locational data for the detected particles have been developed in the prior art. Typically, the particles are detected by laser beam irradiation. The surface of the device is irradiated with a laser beam from one direction and reflected from the surface. The presence of the particles on the surface causes the reflection of the laser beam to scatter at the areas where the particles are present. The sizes and distribution of the particles on the surface are then determined from the scattering intensity of the reflected beam. Variations of this method have been developed for detecting smaller and smaller particle sizes.

Conventionally, device surfaces are cleaned to reduce the particulate contaminants using a chemical wash. The chemical wash ideally removes most of the particles which could cause a defect in the resulting device. However, smaller particles and larger, more difficult to remove particles usually remain on the surface after the chemical wash. The removal of the remaining particles typically requires subsequent chemical washes using harsh chemicals and/or procedures. These subsequent washes are often detrimental to the device surface and add additional cycle time and cost.

Furthermore, the prior art removal techniques do not make any determination of the amount of cleaning necessary based upon the particle size and composition, substrate material and/or particle location. Additionally, the prior art techniques do not differentiate between particles on the surface of a wafer which are in regions that are of no interest or in sensitive areas where there is no need to remove the particles, and those particles that are in regions where it is necessary to remove the particles. Thus, in the prior art techniques, all regions of the wafer are treated and cleaned similarly.

SUMMARY OF THE INVENTION

Therefore, it is an object of the present invention to provide a method and apparatus for combined location and removal of particles on the surface of an object.

It is another object of the present invention to provide a method and apparatus for combined location and removal of particles on the surface of an object without damaging the surface of the object.

It is still another object of the present invention to provide a method and apparatus for combined location and removal of particles on the surface of an object which uses only the amount of cleaning force necessary to remove the particle.

It is still another object of the present invention to provide a method and apparatus for combined location and removal of particles on the surface of an object in which the amount of energy used to remove the particle is based upon the particle's size and/or composition.

It is yet still another object of the present invention to provide a method and apparatus for combined location and removal of particles on the surface of an object which is capable of not effecting the removal of the particle if the particle is in a region of the surface which is either of no interest or which is sensitive to the removal process.

Accordingly, a method for removing one or more particles from a surface of an object is provided. The method comprises first and second steps of detecting and locating the plurality of particles on the surface of the object. In a third step, focused energy is directed onto one or more of the located particles to break a bond energy between the one or more particles and the surface thereby removing the one or more particle from the surface. In preferred variations of the method of the present invention, the object is a semiconductor wafer and the directed focused energy is in the form of a laser.

Also provided is an apparatus for removing the one or more particles from the surface of the object. The apparatus comprises means for detecting and locating the one or more particles on the surface of the object, and means for directing focused energy on one or more of the located particles to break a bond energy between the one or more particles and the surface thereby removing the one or more particles from the surface.

In a first variation of the present invention, method and means for detecting the composition of the one or more located particles are also provided. The amount of focused energy directed at the one or more detected particles is then based upon the detected composition of the one or more particles and/or the particle size.

In a second variation of the present invention, also provided are method and means for determining whether the particle location is or is not in an area of interest, and deciding not to undertake the directing of the laser upon the one or more particles if it is determined that the one or more particles are not located in an area of interest.

In a third variation of the present invention, also provided are method and means for determining whether the detected particle has been removed after the directing step, and repeating the directing and detecting steps with focused energy of increasing power until it is determined that the one or more particle have been removed.

In a fourth variation of the present invention, also provided are method and means for overriding the repeating of the directing and detecting steps if a predetermined number of directing steps have been performed without removing the particle upon which the focused energy is directed.

BRIEF DESCRIPTION OF THE DRAWINGS

These and other features, aspects, and advantages of the present invention will become better understood with regard

DETAILED DESCRIPTION OF THE PREFERRED EMBODIMENTS

Figure 1:
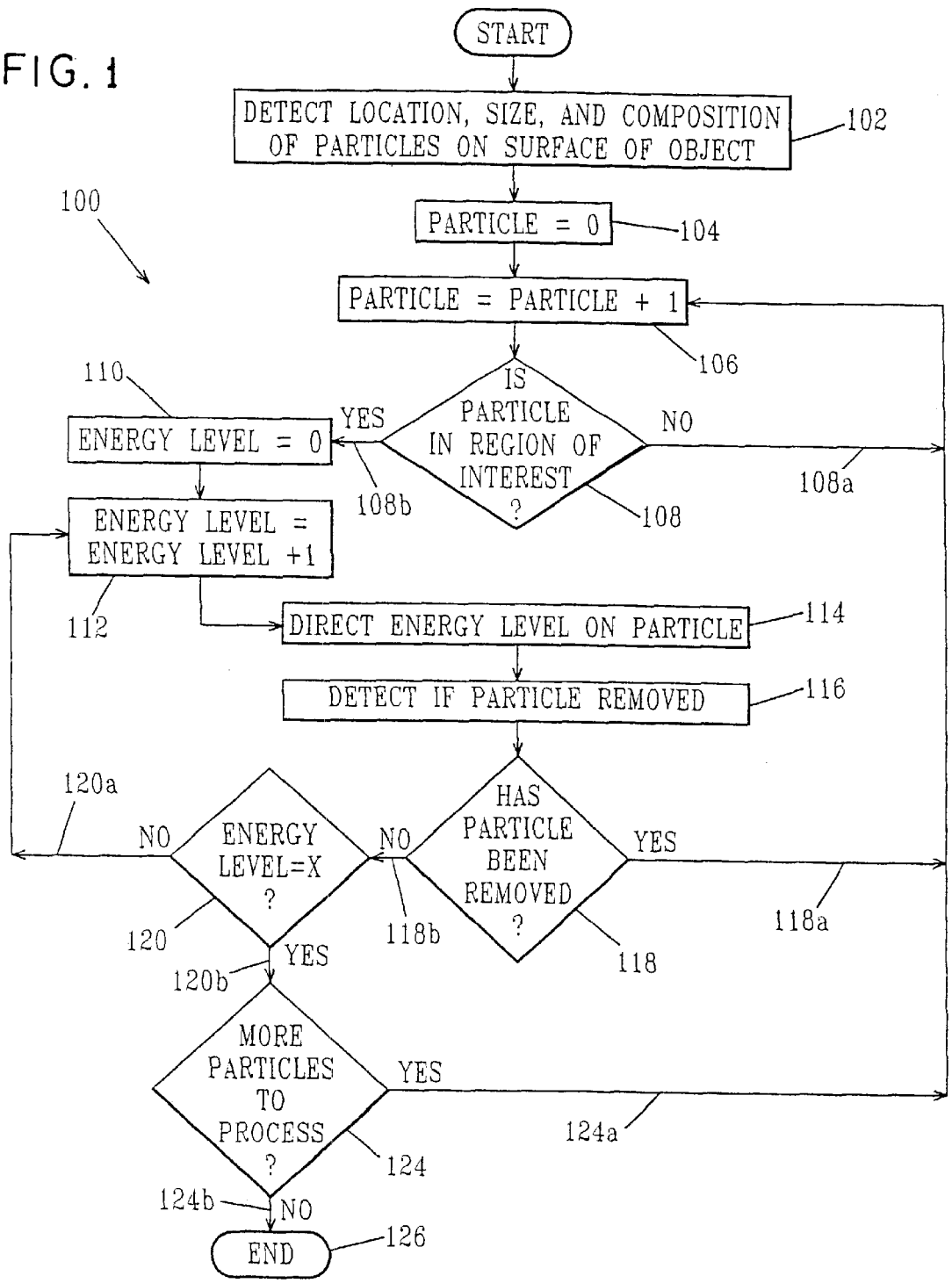
FIG. 1 illustrates a flow chart outlining the steps of the preferred embodiment of the method of the present invention.

Referring now to FIG. 1, there is illustrated a flow chart of the method of the present invention, referred to generally by reference numeral 100 wherein particles are removed from the surface of an object without altering or damaging the surface's molecular structure. The method 100 starts at step 102 by detecting and locating particles on the surface of an object. The sizes of the located particles range from submicron sizes and greater. Although this method 100 is applicable to the removal of particles from numerous and various types of objects, it has been found particularly useful in the environment of the semiconductor wafers. Therefore, without limiting the applicability of the invention to the removal of particles from semiconductor wafers, the invention will be described in such environment.

The detection and location steps (102) involve both the detection of the particles on the surface of the semiconductor wafer and generating and storing location data for each of the particles detected on the surface. Step 102 is accomplished by any adequate method known in the art, such as that disclosed in U.S. Pat. No. 4,641,967 to Pecen. Preferably, the composition of the particles (i.e., organic, inorganic, Si, metallic, etc.) is also determined and stored as part of step 102. A detector means for carrying out step 102 of the method 100 of the present invention is described in more detail below with reference to FIG. 2. Preferably, step 102 generates a two or three dimensional map of the surface of the wafer in which any located particles are represented by location, size data, and/or particle composition data. This data is preferably stored in a memory storage device, preferably that common to a personal computer.

Referring back to FIG. 1, the method 100 then proceeds to process each detected particle on the surface of the semiconductor wafer one at a time. This is shown schematically by steps 104 and 106 of the flowchart of FIG. 1. At step 104 the number of the located particle is initialized at zero. At step 106, the number of the located particle is incremented by one, signifying that after a current particle is located and processed (e.g., attempted removal) a subsequent located particle is next processed. In the following description of the method 100, the term "particle" means the current particle being processed, unless described otherwise.

Alternatively, a test can next be performed at step 108. Step 108 determines if the located particle is in an area of interest on the wafer surface or a sensitive area in which the removal steps may damage the sensitive area. Such may be the case where the semiconductor wafer is covered with regions of photoresist. In this situation, step 102 will also compare to a digitized layout or data base of the areas of photoresist and provide that information to the system so that the system exactly knows which particles are not to be processed because they are in sensitive areas. Otherwise, if the method 100 attempted to remove the particle in a sensitive area, the photoresist area itself may be destroyed or damaged. Since the photoresist is sacrificial (later removed), the particle is better off left alone rather than trying to remove it. Therefore, if it is determined that the particle is not in an area of interest or in a sensitive area, the method 100 proceeds along route 108a which loops back to step 106 where the next particle in the particle map becomes the current particle.

If the particle is in an area of interest, the method 100 proceeds along step 108b to step 110. At step 110, the energy level of a means which directs energy at the particle is initialized at zero. Preferably, the means for directing energy at the particle is a laser. At step 112, the energy level of the laser is then incremented to a first energy level chosen to remove the most loosely bonded particles and to minimize any unnecessary destruction to the wafer surface caused by the laser. Alternatively, the first energy level can also be chosen based upon the composition of the located particle, and/or the composition of the wafer substrate, and the resulting known bond between them.

At step 114, the laser is directed at the particle at the first energy level, based upon the location and particle characteristic data generated at step 102. After the laser is directed onto the particle, a determination is made at steps 116 and 118 to determine if the particle has been removed. Preferably, the apparatus used to carry-out step 102 is again used to make the determination in steps 116 and 118. If the particle has been removed, the method 100 proceeds along route 118a to loop back to step 106 where the next particle in the particle map is made the current particle and steps 108 through 118 repeated.

If the particle has not been removed, the method 100 proceeds along route 118b in which the method 100 loops back to step 112, where the energy level of the laser is incremented to a second level. Steps 114 to step 118 are then repeated for the particle at the second energy level. This loop repeats until the particle is removed. A single laser capable of many energy levels can be used and/or a plurality of lasers can be utilized which each have a different energy level or capable of its own range of energy levels. As discussed earlier, the energy levels utilized can be chosen such that the bond energies between common particulate contaminants and wafer substrate materials will be broken. Common particulate contaminants include carbonaceous compounds and silicon oxides and nitrides. Common wafer surface materials include silicon, titanium, germanium, gallium arsenide, copper, and aluminum.

Alternatively, the method includes step 120 which allows a user to input a maximum number of repetitions, or energy levels (denoted as X in FIG. 1), after which the energy level of the laser will no longer be incremented, and the method will move on to the next particle. In effect, the method 100 will "give up" on the removal of stubborn particles in order to prevent damage to the wafer surface caused by using excessive energy to remove the particle. This is shown schematically in FIG. 1 by route 120a which loops back to increment the energy level at step 112 if the maximum number of repetitions (X) has not been reached, or continues along path 120b if the maximum number of repetitions (X) has been reached. If the maximum number of repetitions has been reached, the method 100 proceeds to step 124, where it is determined if there are any more particles on the surface of the wafer that need to be processed. If it is determined that more particles need to be processed, then the method proceeds along route 124a, which loops back to step 106. If all the located particles have been processed, the method 10 proceeds along route 124b to step 126 where the method 100 terminates.

Not shown in FIG. 1, is the preferred step of directing a flow of gas either directed or sweeping across the wafer surface to carry away any debris or particles dislodged during the method 100. Preferably, the gas is inert, such as Helium, Argon, or Nitrogen. It should be appreciated that inert means any non-reactive gas. The directing of the gas can be continuous during the method 100 or it can be pulsed on to coincide with the energizing of the laser. However, it is understood by someone skilled in the art that the method 100 can alternatively be carried out in a vacuum, a partial vacuum, at ambient pressure, or in a pressurized chamber without departing from the scope or spirit of the invention.

Preferably, method 100 is automated by a central processor (shown in FIG. 2), which controls the entire process and eliminates any human intervention. In this situation, the central processor, preferably a personal computer, controls the detection, location, and composition of the particles on the surface of the wafer; generates and stores a database associated with each particle (i.e., particle location, size, composition, number for processing, etc.); controls the directing of the laser at each particle along with the power level of the laser; controls the determination of whether the particle has been removed after each successive energy level loop (steps 112 to 118); accepts an inputted maximum number of repetitions (X) from a user and determines whether that maximum has been achieved; and generates a control signal to direct a flow of gas across the wafer surface.

Method 100 can also include a multi-tasking of certain steps. For example, while some lasers are performing the positional and/or compositional analysis of step 102, other lasers can be performing removal step 114 of previously located particles.

Figure 2:
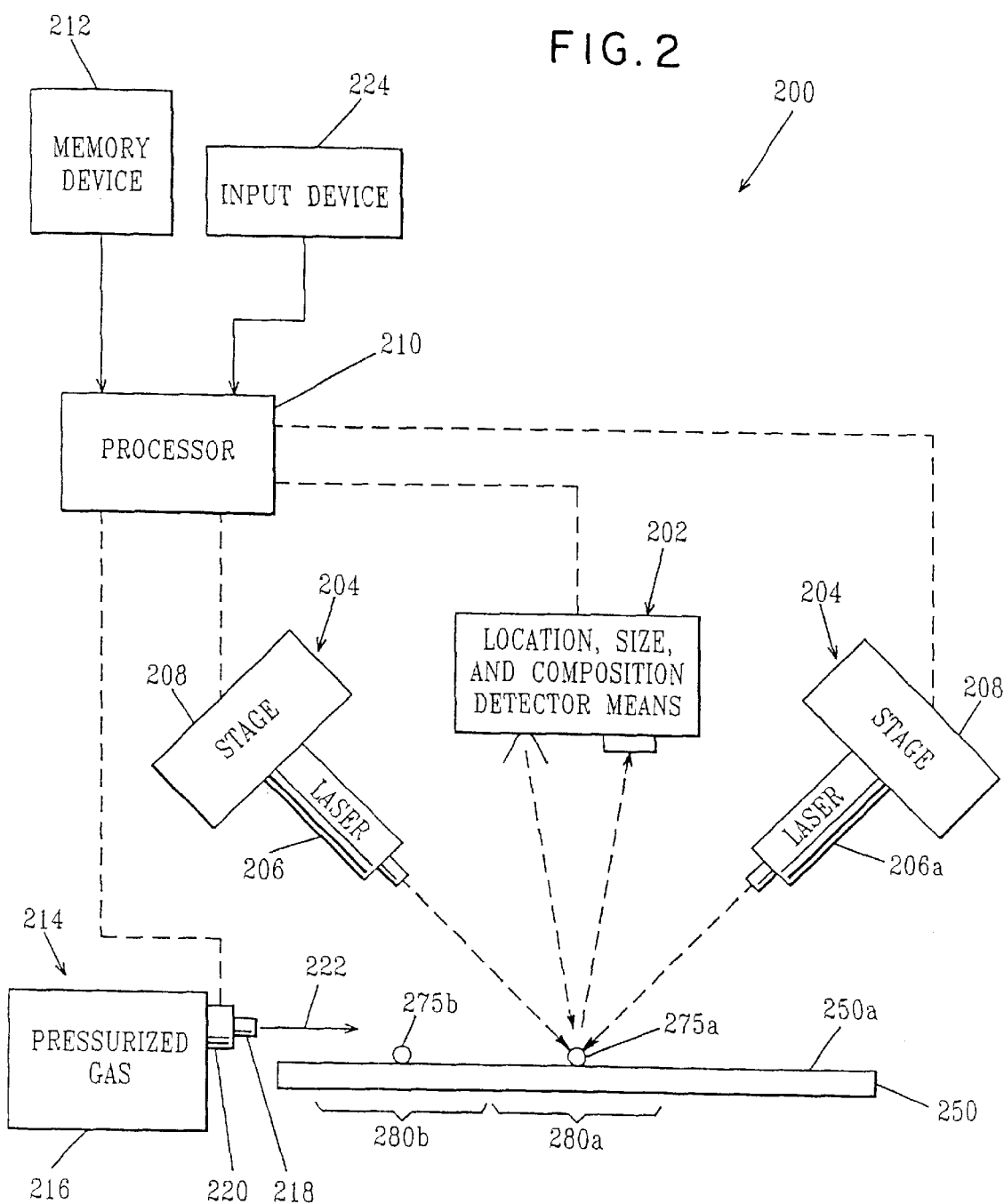
FIG. 2 illustrates a preferred apparatus for carrying out the method of the present invention.

Referring now to FIG. 2, there is illustrated a preferred embodiment of an apparatus for carrying-out the method of the present invention, the apparatus being generally referred to by reference numeral 200. The apparatus 200 generally includes a means 202 for detecting and locating particles 275a, 275b on the surface 250a of an object 250, preferably a silicon wafer. Preferably, the means 202 for detecting and locating particles also includes a means for detecting the composition of the located particles. Any means known in the art for detecting and locating particles on the surface of an object and/or detecting the composition of the located particles can be utilized in the apparatus 200 of the present invention without departing from the scope and spirit of the invention.

Typically, the means 202 for detecting and locating particles, as well as for detecting the composition of the detected particles comprises a known composition detection system in the art, such as an EDX (Energy Dispersive X-ray) or Auger spectroscopy system. The data generated by the means 202 for detecting and locating particles is processed by a central processor 210, and stored on a memory device 212. The central processor 210 is preferably a personal computer having a hard drive 212.

The apparatus 200 also includes a means 204 for directing energy on one of the located particles 275a to break the bond energy between the particle 275a and the surface 250a. Preferably, the means 204 for directing energy comprises a laser 206 coupled to a three axis, or X-Y-Z, stage 208. The laser 206 can also be a three axis laser connected to a stage 208 for providing the same function. The stage 208 is preferably controlled by the processor 210, but could be controlled by a second independent processor (not shown). The processor 210 is fed with the locational data from the means 202 for detecting and locating particles and inputs the stage 208 to direct the laser 206 at the particle 275a based on the relative geometry of the laser 206 with respect to the particle 275a. The processor 210 also turns on the laser 206 at the necessary energy level setting based upon the particle size and/or composition.

Alternatively, the apparatus 200 also includes a means 214 for directing gas flow across the surface 250a of the object 250 for carrying away any removed particles. The gas is preferably an inert/non-reactive gas such as Helium, Argon, or Nitrogen. The means 214 for directing the gas flow preferably comprises a compressed gas source 216, such as a bulk supply or canister, having an outlet 218 directed towards the surface 250a of the object 250. Connected to the outlet 218 is a valve 220, preferably a solenoid. The solenoid 220 can be operated manually or by the central processor 210 such that the valve opens, allowing the gas 222 to flow across the surface 250a, preferably during the operation of the laser(s) 206. Again, the valve 220 can be controlled by the central processor 210 or by an independent processor.

Alternatively, the apparatus 200 of the present invention also has a means for determining whether the particle location is or is not in an area of interest and means for deciding not to direct energy on the particle if it is determined that the particle is not located in an area of interest. Preferably both of these means are carried out by both the means 202 for detecting and locating and by the central processor 210. Preferably, the means 202 for detecting and locating also maps the areas of interest 280a and areas not of interest 280b, also referred to as a sensitive area. This data is then stored and fed to the central processor 210. When a particle 275b is to be processed which falls in an area not of interest 280b, the processor will decide not to direct energy onto the particle 275b and instead process the next particle on the particle map.

As discussed previously, the apparatus 200 of the present invention also preferably includes means for detecting whether the located particle 275a has been removed after energy has been directed upon it and means for repeating the directing of energy and the detecting if the particle 275a has been removed with energy of increasing power until it is detected that the particle 275a has been removed. The means for detecting if the particle has been removed after energy is directed on it is preferably done by the means 202 for detecting and locating which remaps the surface and decides if the particle 275a upon which the energy was previously directed is still on the surface 250a. The means for repeating the direction of energy and the detection of whether the particle has been removed with increasing levels of energy until the particle is removed is accomplished by the processor 210. After choosing the initial energy level for the laser 206, based upon the particle's size and/or composition, if it is detected that the particle has not been removed, the processor will increment the energy level of the laser 206 and repeat the process of directing energy and detecting whether it has been removed until it is detected that the particle has actually been removed. Preferably, a single laser 206 capable of many energy level settings is utilized, however, a plurality of lasers 206, 206a may be used, each with a different energy level or capable of a different range of energy levels.

Alternatively, instead of continually increasing the energy level of the laser(s) until it is detected that the particle has been removed, a means for overriding the repeating of the directing and detecting steps can be provided if energy of increasing power has been performed a predetermined number of times without removing the particle upon which the energy is directed. Thus, the apparatus 200 will give up on stubborn particles so as not to damage the surface 250a of the object 250. This is generally accomplished by inputting the predetermined number into the processor 210 by way of an input device 224, preferably a keyboard. Thus, the processor 210 will repeat the above process, increasing the energy level of the laser 206 for each repetition until the predetermined number of energy level increments has been made, in which case the processor will instruct the apparatus 200 to move on to the next particle.

The present invention therefore provides the weaving of the following diverse aspects into an integrated "search and destroy" mission to remove particulate contaminants from the surface of a semiconductor wafer after applying a decision making algorithm to determine:

(a) what particles can be removed;

(b) what particles should he removed;

(c) what force/energy should be used to remove the particles; and (d) under what circumstances is the removal process aborted in order to preserve the integrity of the semiconductor wafer?

While there has been shown and described what is considered to be preferred embodiments of the invention, it will, of course, be understood that various modifications and changes in form or detail could readily be made without departing from the spirit of the invention. It is therefore intended that the invention be not limited to the exact forms described and illustrated, but should be constructed to cover all modifications that may fall within the scope of the appended claims.

Having thus described our invention, what we claim as new, and desire to secure by Letters Patent is:

1. A method for removing one or more particles from a surface of an object, the method comprising the steps of:

(a) detecting the one or more particles on the surface of the object, wherein said detecting is based on location of one or more of said particles, size of one or more of said particles, composition of said one or more of said particles or any combination thereof, (b) locating the one or more particles on the surface of the object by generating location data in response to the detecting step, and (c) directing focused energy to only the one or more located particles based upon their location for removing the located particles from the surface without altering the surface of the object.

2. The method of claim 1, wherein the object is a semiconductor wafer.

3. The method of claim 1, further comprising the step of determining the composition of the one or more located particles.

4. The method of claim 3, further comprising the step of adjusting the amount of energy directed at the detected particles based upon the detected size, composition, location of the particles or any combination thereof.

5. The method of claim 1, further comprising the steps of:

(i) determining whether the one or more particles located in step (b) are located in an area of interest, and (ii) deciding to perform step (c) if it is determined that the one or more particles are located in an area of interest.

6. The method of claim 1, further comprising the steps of:

(i) determining whether the one or more particles located in step (b) are not located in an area of interest, and (ii) deciding not to perform step (c) if it is determined that the one or more particles are not located in an area of interest.

7. The method of claim 6, wherein the object is a semiconductor wafer having sensitive regions, wherein the sensitive regions are not areas of interest.

8. The method of claim 7, wherein the sensitive regions are regions of photoresist mask.

9. The method of claim 1, further comprising the step of determining whether the one or more located particles have been removed after performing step (c).

10. The method of claim 9, further comprising the step of repeating step (c) and the determining step with focused energy of increasing power until it is determined that the one or more particles have been removed.

11. The method of claim 10, further comprising the step of overriding the repeating step if a predetermined number of directing steps have been performed without removing the one or more particles upon which the focused energy is directed.

12. The method of claim 1, further comprising the step of directing gas flow across the surface of the object for carrying away any removed particles.

13. The method of claim 12, wherein the gas is an inert or non-reactive gas.

14. The method of claim 13, wherein the inert gas is selected from a group consisting of helium, argon, and nitrogen.

15. An apparatus for removing one or more particles from a surface of an object, the apparatus comprising:

means for detecting the one or more particles on the surface of the object, wherein said means for detecting is based on location of one or more of said particles, size of one or more of said particles, composition of said one or more of said particles or any combination thereof, means for locating the one or more particles on the surface of the object which generates location data in response to the means for detecting, and means for directing focused energy to only the one or more located particles based upon their location for removing the one or more located particles from the surface without altering the surface of the object.

16. The apparatus of claim 15, wherein the object is a semiconductor wafer.

17. The apparatus of claim 15, further comprising a means for determining the composition of the one or more located particles.

18. The apparatus of claim 17, further comprising means for adjusting the amount of focused energy directed at the one or more located particles based upon the determined composition of the one or more particles.

19. The apparatus of claim 15, further comprising:

means for determining whether the one or more located particles are located in an area of interest, and means for deciding to direct focused energy on the one or more located particles if it is determined that the one or more located particles are located in an area of interest.

20. The apparatus of claim 15, further comprising:

means for determining whether the one or more located particles are not located in an area of interest, and means for deciding not to direct focused energy on the one or more located particles if it is determined that the one or more located particles are not located in an area of interest.

21. The apparatus of claim 20, wherein the object is a semiconductor wafer having sensitive regions, wherein the sensitive regions are not areas of interest.

22. The apparatus of claim 21, wherein the sensitive regions are regions of photoresist mask.

23. The apparatus of claim 15, further comprising means for determining whether the one or more located particles have been removed after focused energy has been directed upon them.

24. The apparatus of claim 23, further comprising means for repeating the directing of focused energy and the determining if the one or more particles have been removed with focused energy of increasing power until it is determined that the one or more particles have been removed.

25. The apparatus of claim 24, further comprising means for overriding the repeating of the directing and determining steps if focused energy of increasing power has been applied a predetermined number of times without removing the one or more particles upon which the focused energy is directed.

26. The apparatus of claim 15, further comprising means for directing gas flow across the surface of the object for carrying away any removed particles.

27. The apparatus of claim 26, wherein the gas is an inert or non-reactive gas.

28. The apparatus of claim 27, wherein the inert or nonreactive gas is selected from a group consisting of helium, argon, and nitrogen.

29. The apparatus of claim 26, wherein the means for directing gas flow across the surface comprises:

a compressed gas source having an outlet directed towards the surface of the object, a valve connected to the outlet, and a processor for signaling the valve to open thereby directing the gas across the surface of the object.

30. The apparatus of claim 15, wherein the means for directing focused energy comprises:

a laser, a three axis stage connected to the laser, and a processor which is input with the location data for the particles from the means for locating, and outputs the three axis stage to take a position which directs the laser connected thereto to focus its energy onto the one or more particles.

31. The apparatus of claim 15, wherein the means for directing focused energy comprises:

stage, a three axis laser connected to the stage, and a processor which is input with the location data for the one or more particles from the means for locating, and outputs the three axis laser to take a position which directs the laser to focus its energy onto the one or more particles.

32. The apparatus of claim 15, wherein the means for detecting and locating the one or more particles on the surface of the object comprises:

a light source directed toward the surface, a detector for detecting scattered light from the surface, and a processor for correlating the detected scattered light from the surface into a map of the one or more particles size and location on the surface in at least two dimensions.

33. The apparatus of claim 32, wherein the map of the particles size and location on the surface is expressed in two dimensions.

34. The apparatus of claim 32, wherein the map of the particles size and location on the surface is expressed in three dimensions.

* * * * *